United States Patent
Rocci et al.

(10) Patent No.: US 11,307,262 B2
(45) Date of Patent: Apr. 19, 2022

(54) CLOUD MANAGED HIGH VOLTAGE BATTERY PROFILE RECOVERY

(71) Applicant: FORD GLOBAL TECHNOLOGIES, LLC, Dearborn, MI (US)

(72) Inventors: Benjamin M. Rocci, Ann Arbor, MI (US); Michael David Beeney, Canton, MI (US); Mark Anthony Rockwell, Royal Oak, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 466 days.

(21) Appl. No.: 15/982,527

(22) Filed: May 17, 2018

(65) Prior Publication Data

US 2019/0353710 A1 Nov. 21, 2019

(51) Int. Cl.

| | |
|---|---|
| *G01R 31/36* | (2020.01) |
| *G01R 31/387* | (2019.01) |
| *G01R 31/392* | (2019.01) |
| *B60K 6/28* | (2007.10) |
| *B60L 58/10* | (2019.01) |
| *B60L 58/16* | (2019.01) |
| *G07C 5/00* | (2006.01) |

(Continued)

(52) U.S. Cl.
CPC ............ *G01R 31/392* (2019.01); *B60L 58/10* (2019.02); *G01R 31/3648* (2013.01); *G01R 31/387* (2019.01); *G07C 5/008* (2013.01); *G07C 5/08* (2013.01); *H01M 10/425* (2013.01); *B60K 6/28* (2013.01); *B60L 58/16* (2019.02); *B60Y 2200/91* (2013.01); *B60Y 2200/92* (2013.01); *H01M 2010/4271* (2013.01); *H01M 2010/4278* (2013.01); *H01M 2220/20* (2013.01); *Y10S 903/907* (2013.01)

(58) Field of Classification Search
CPC .............. G01R 31/392; G01R 31/387; G01R 31/3648; G07C 5/008; G07C 5/08; G07C 5/0841; B60L 58/16; B60L 2240/54; B60L 53/65; B60L 53/80; B60L 3/12; H01M 10/425; H01M 2010/4278; H01M 2010/4271; H01M 2220/20; B60K 6/28; Y10S 903/907; B60Y 2200/91; B60Y 2200/92; G06F 8/71
USPC ......................................................... 702/63
See application file for complete search history.

(56) References Cited

U.S. PATENT DOCUMENTS 9,772,383 B2    9/2017  Carlo et al.
2010/0216521 A1*  8/2010  Wu .................. H04W 52/0258
                                                  455/572

(Continued)

FOREIGN PATENT DOCUMENTS

WO    WO 2019/184850    *  2/2019

OTHER PUBLICATIONS

Translation for WO 2019/184850 (Year: 2019).*

*Primary Examiner* — Michael P Nghiem
*Assistant Examiner* — Dacthang P Ngo
(74) *Attorney, Agent, or Firm* — Michael J. Spenner; Brooks Kushman P.C.

(57) ABSTRACT

A system includes a memory storing a battery profile corresponding to a battery identifier of a high-voltage battery of a vehicle and a processor. The processor is programmed to periodically send the battery profile to a server, and, responsive to detecting a change in the battery identifier, request the server to send a battery profile corresponding to the battery identifier as changed.

23 Claims, 4 Drawing Sheets

(51) Int. Cl.
    *G07C 5/08*         (2006.01)
    *H01M 10/42*     (2006.01)

(56) References Cited

U.S. PATENT DOCUMENTS

| | | | |
|---|---|---|---|
| 2013/0093384 A1* | 4/2013 | Nyu | B60L 53/66 |
| | | | 320/107 |
| 2014/0229129 A1* | 8/2014 | Campbell | H04Q 9/00 |
| | | | 702/63 |
| 2015/0140379 A1* | 5/2015 | Yau | H01M 10/4221 |
| | | | 429/90 |
| 2018/0300965 A1* | 10/2018 | Mori | G07C 5/004 |
| 2019/0278352 A1* | 9/2019 | Lin | H02J 7/0063 |

\* cited by examiner

CLOUD MANAGED HIGH VOLTAGE BATTERY PROFILE RECOVERY

TECHNICAL FIELD

Aspects of the disclosure generally relate to cloud management of battery profiles for storage and recovery.

BACKGROUND

Battery capacity is an important parameter for a successful battery monitoring system. For example, accurate battery capacity is critical to the accurate estimation of state of charge. Battery capacity also determines how much energy is stored in the battery, and thus determines the EV range for an electrified vehicle. Battery capacity can fade with the battery aging, especially when the battery is intensively used. Therefore, electric vehicles include systems to learn information indicative of the capacity of the vehicle battery.

SUMMARY

In one or more illustrative examples, a system includes a memory storing a battery profile corresponding to a battery identifier of a high-voltage battery of a vehicle and a processor. The processor is programmed to periodically send the battery profile to a server, and, responsive to detecting a change in the battery identifier, request the server to send a battery profile corresponding to the battery identifier as changed.

In one or more illustrative examples, a method includes responsive to detecting a change in a battery identifier of a battery of a vehicle, requesting a server, in communication with the vehicle over a wide-area network, to send a battery profile corresponding to the battery identifier to the vehicle; and utilizing the battery profile to adapt a battery control strategy for the battery.

In one or more illustrative examples, a non-transitory computer-readable medium includes instructions that, when executed by a processor of a vehicle, cause the vehicle to responsive to detection of a change in a battery identifier of a battery of the vehicle, request a server in communication with the vehicle over a wide-area network to send a battery profile corresponding to the battery identifier to the vehicle; and utilize the battery profile to adapt a battery control strategy for the battery.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

For a hybrid or battery electric vehicle to function optimally, a battery energy control module (BECM) of a vehicle is designed to utilize certain battery characteristics (such as battery pack capacity and battery power capability). These characteristics are normally learned during vehicle operation by the BECM and, as they change, the battery control strategy adapts accordingly.

When a BECM fails or when a battery is replaced, these characteristics are lost or become unknown. For example, a discharged battery pack may be swapped for a charged battery pack to expedite recharging of the vehicle. In the case of a BECM failure and replacement, the new BECM would require time to learn the characteristics of the existing battery. In a case where a different battery is swapped into the vehicle, the existing BECM would require time to learn the characteristics of the swapped battery. However, the vehicle operation time required by the BECM to learn battery characteristics is time that the vehicle powertrain may not be operating optimally, which affects vehicle efficiency and range.

Remotely stored battery profiles may be used to quickly recover learned characteristics for a given battery and transfer these characteristics to the BECM. The proliferation of embedded modems in vehicles makes it possible for the BECM to periodically offload a battery profile to a cloud data base. The battery profile may include a unique identifier which corresponds to a specific battery pack. When a vehicle's BECM communicates with a battery on-board the vehicle with an unrecognized unique identifier, the BECM may direct the vehicle to request the most recent battery profile associated with that battery pack from a remote database via the vehicle's embedded modem. The cloud manager may then return the requested profile, which will be forwarded by the vehicle to the BECM, enabling the battery control strategy to return to operation at an optimal level.

Figure 1:
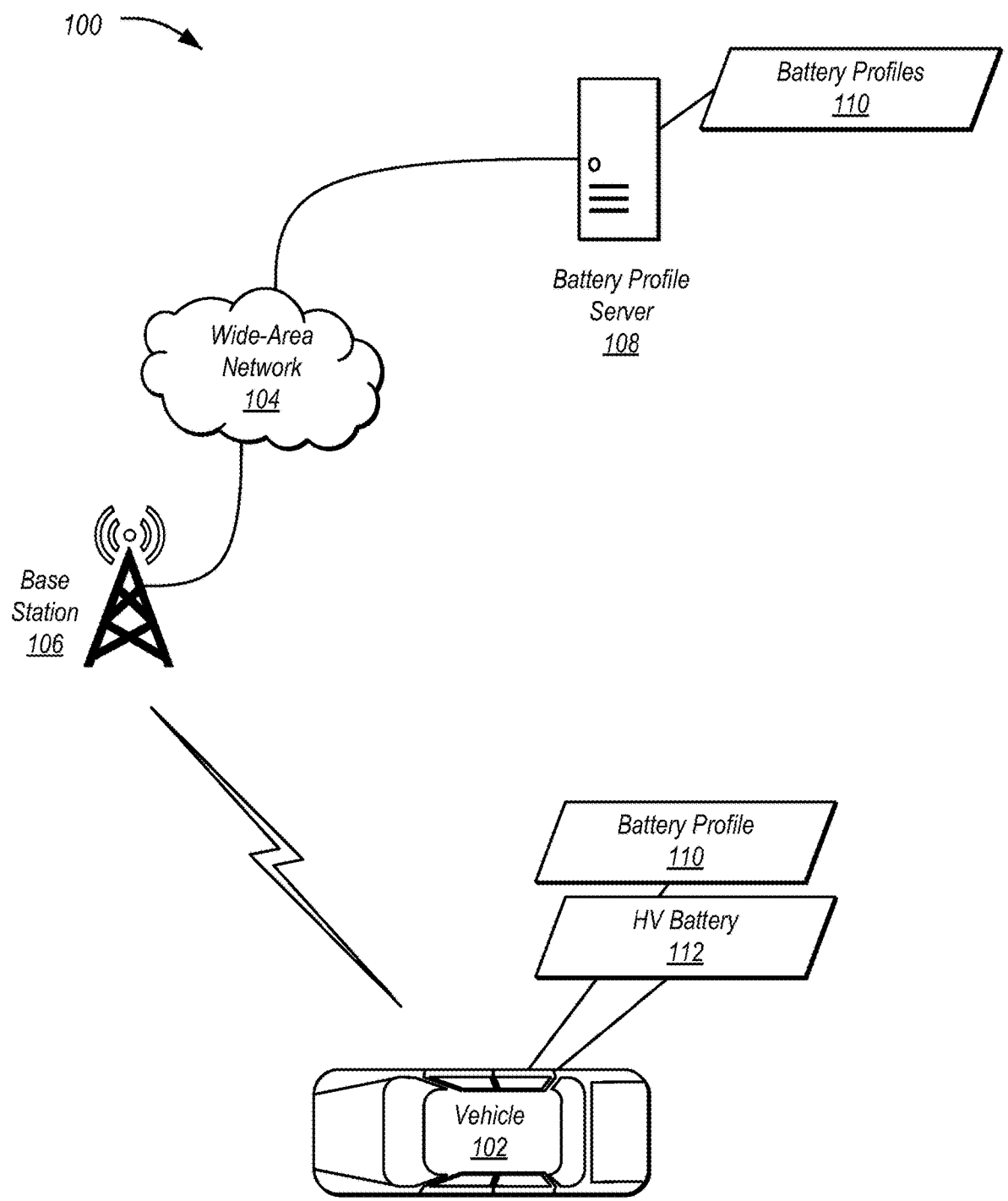
FIG. 1 illustrates an example system for provisioning of battery profiles to vehicles.

FIG. 1 illustrates an example system 100 for provisioning of battery profiles 110 to vehicles 102. As shown, the system 100 includes a vehicle 102 in communication with a battery profile server 108 over a wide-area network 104. The vehicle 102 is configured to wirelessly communicate with base stations 106 connected to the wide-area network 104. Only one base station 106 is shown for clarity, but it should be noted that systems 100 typically include many base stations 106 arranged to cover a large geographical area. While an example system 100 is shown in FIG. 1, the example components as illustrated are not intended to be limiting. Indeed, the system 100 may have more or fewer components, and additional or alternative components and/or implementations may be used. As an example, the system 100 may include more or fewer vehicles 102, base stations 106, and/or battery profile servers 108. In other examples, the vehicle 102 may communicate with the battery profile server 108 over connections other than via the base station 106, such as via WiFi, dedicated short range communication (DSRC), or another communications protocol over which battery profiles 110 may be sent and/or received.

The vehicles 102 may include various types of automobile, crossover utility vehicle (CUV), sport utility vehicle (SUV), truck, recreational vehicle (RV), boat, plane or other mobile machine for transporting people or goods. In many cases, the vehicle 102 may be powered by an internal combustion engine. As another possibility, the vehicle 102 may be a hybrid electric vehicle (HEV) powered by both an internal combustion engine and one or more electric motors, such as a series hybrid electric vehicle (SHEV), a parallel hybrid electrical vehicle (PHEV), or a parallel/series hybrid electric vehicle (PSHEV). In other examples, the vehicle 102 may be a hydrogen powered vehicle 102. As the type and configuration of vehicle 102 may vary, the capabilities of the vehicle 102 may correspondingly vary. As some other possibilities, vehicles 102 may have different capabilities with respect to passenger capacity, towing ability and capacity, and storage volume. Further aspects of the functionality of the vehicle 102 are discussed in detail with respect to FIG. 2.

The wide-area network 104 may include one or more interconnected communication networks such as the Internet, a cable television distribution network, a satellite link network, a local area network, and a telephone network, as some non-limiting examples. By accessing the wide-area network 104, the vehicle 102 may be able to send outgoing data from the vehicle 102 to network destinations on the wide-area network 104, and receive incoming data to the vehicle 102 from network destinations on the wide-area network 104.

The base stations 106 may include system hardware configured to allow cellular transceivers of the vehicles 102 to access the communications services of the wide-area network 104. In an example, the base stations 106 may be part of a Global System for Mobile communication (GSM) cellular service provider. In another example, the base stations 106 may be part of a code division multiple access (CDMA) cellular service provider. The base stations 106 may support various different technologies and data speeds.

The battery profile server 108 may include computing hardware configured to provide data services related to sending battery profiles 110 to the vehicles 102 and/or receiving battery profiles 110 from the vehicles 102. The battery profiles 110 may include information about the characteristics of a HV battery 112 of the vehicle 102. These characteristics may include, for example, a measure of battery capacity of the HV battery 112 determined over time via monitoring usage of the HV battery 112. The battery profiles 110 may further include a unique identifier which corresponds to a specific battery pack.

Figure 2:
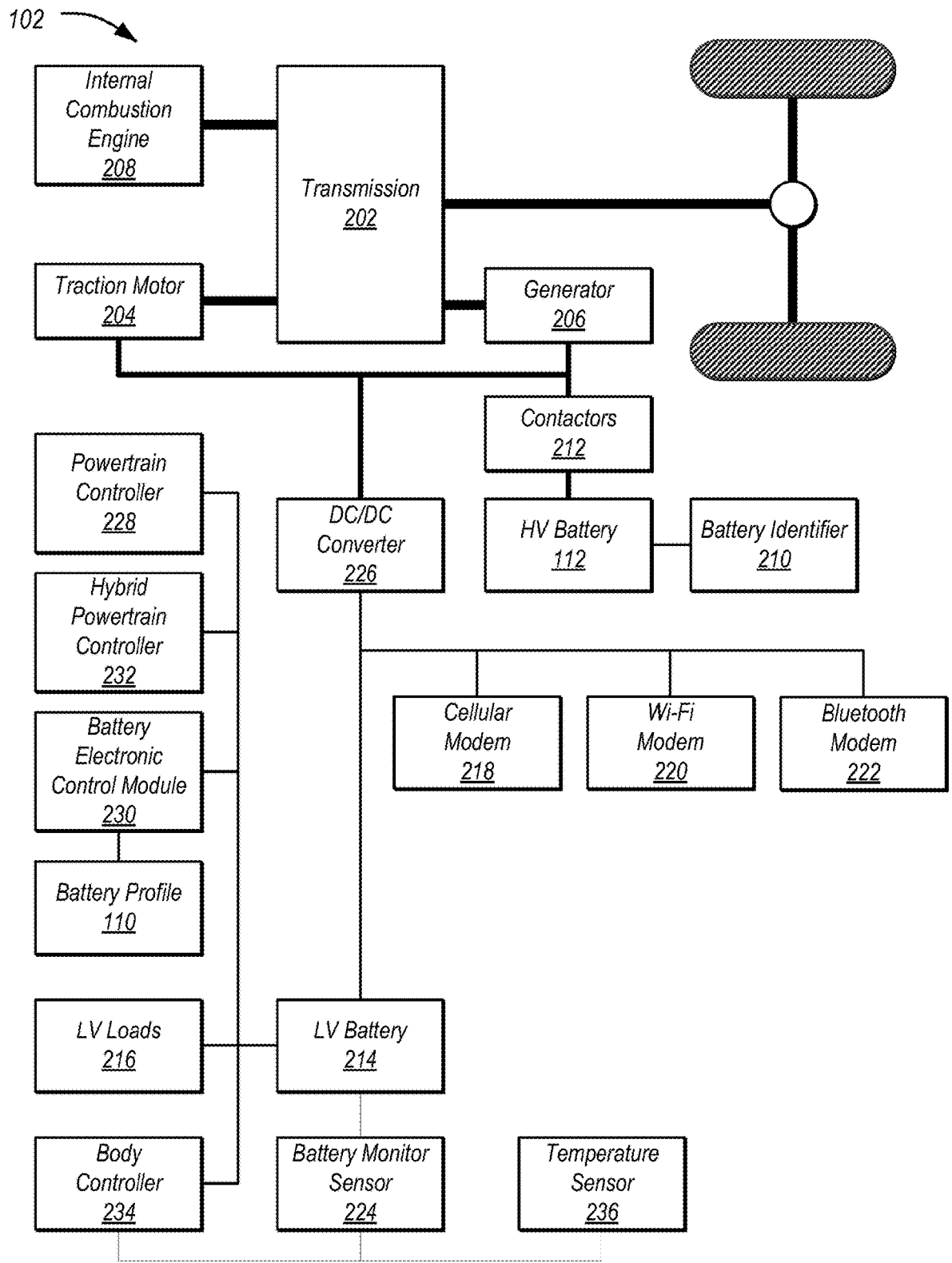
FIG. 2 illustrates an example hybrid electric vehicle.

FIG. 2 illustrates further aspects of the vehicle 102. FIG. 2 illustrates representative relationships among the components. Physical placement and orientation of the components within the vehicle may vary. The vehicle 102 includes a transmission 202 and is propelled by at least one electric machine 204, 206 with selective assistance from an internal combustion engine 208. As shown, the transmission 202 may be a power-split configuration, in that the transmission 202 includes the first electric machine 204 and a second electric machine 206. The electric machine(s) 204, 206 may be alternating current (AC) electric motors in an example. The electric machine 204 receives electrical power and provides torque for vehicle propulsion. The second electric machine 206 also functions as a generator for converting mechanical power into electrical power and optimizing power flow through the transmission 202. In other embodiments, the transmission 202 does not have a power-split configuration, and may utilize only a single electric machine for propulsion and generation. It should be understood that the schematic illustrated in FIG. 2 is merely exemplary and is not intended to be limited. Indeed, other configurations of engine 208 and electric machines 204, 206 to transmit power through the transmission 202 are contemplated.

The vehicle 102 includes an energy storage device, such as the traction HV battery 112 for storing electrical energy. The traction battery 112 is a high-voltage battery that is capable of outputting electrical power to operate the electric machines 204, 206. The HV battery 112 also receives electrical power from the electric machines 204, 206 when they are operating as generators. The HV battery 112 is a battery pack made up of several battery modules (not shown), where each battery module contains a plurality of battery cells (not shown). A high-voltage bus electrically connects the HV battery 112 to the electric machines 204, 206 through contactors 212, such that the HV battery 112 is connected to the electric machines 204, 206 when the contactors 212 are electrically engaged, and is disconnected from the electric machines 204, 206 when the contactors 212 are electrically disengaged. The HV battery 112 may also be associated with a battery identifier 210, which may, for example, be stored to the HV battery 112 and accessible from a vehicle bus or dedicated connection to the HV battery 112. In another example, the battery identifier 210 may be identified via a barcode read from the HV battery 112.

The vehicle 102 also includes a LV battery 214 connected to a low-voltage bus powering low-voltage loads 216 of the vehicle 102. As some examples, the low-voltage loads 216 may include a cellular modem 218, a WiFi modem 220, and a BLUETOOTH modem 222. A battery monitor sensor 224 is connected to the low-voltage battery 214, and provides a voltage measurement signal that may be used to measure and/or calculate the State of Charge (SoC) of the low-voltage battery 214. A temperature sensor 236 is also provided within the vehicle 102 to provide a signal indicative of the temperature of the surroundings of the LV battery 214 and/or of the vehicle 102.

The vehicle 102 also includes a DC-DC converter 226 or variable voltage converter (VVC). The converter 226 is electrically connected between the high voltage bus (connecting the traction battery 112 and the first electric machines 204, 206) and the low voltage bus system powered by the low-voltage battery 214. The converter 226 "bucks" or decreases the voltage potential of the electrical power provided from the high-voltage battery 112 to the low-voltage battery 214. The converter 226 may also "boost" or increase the voltage potential of the electrical power provided by the low-voltage battery 214 to power the high-voltage battery 112 side of the converter 226 in some embodiments.

The vehicle 102 further includes various controllers configured to manage the operation of the drive components of the vehicle 102. As shown, the vehicle 102 includes a powertrain control unit (PCU) 228 configured to control the engine 208; a hybrid powertrain control module (HPCM) 230 configured to control the transmission 202; a high-voltage battery electronic control module (BECM) 232 configured to control the high-voltage battery 112, contactors 212, and other high-voltage components; and a body control module (BCM) 234 configured to manage ancillary low-voltage functions of the vehicle 102 such as headlights and door locks.

While each of these controllers is illustrated as independent controllers, the PCM 228, HPCM 230, BECM 232, and BCM 234 may each be part of a larger control system and may be controlled by one another or by various other controllers throughout the vehicle 102. It should therefore be understood that the PCM 228, HPCM 230, BECM 232, and BCM 234 and one or more other controllers can collectively be referred to as a "system controller." This system controller controls various actuators in response to signals from various sensors to control functions such as starting/stopping the engine 208, operating the electric machines 204, 206 to provide wheel torque or charge the high-voltage battery 112, select or schedule transmission shifts with the transmission 202, etc. The controller or controllers may include a microprocessor or central processing unit (CPU) in communication with various types of computer readable storage devices or media. Computer readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller in controlling the engine or vehicle.

The system controller communicates with various engine/vehicle sensors and actuators via an input/output (I/O) interface that may be implemented as a single integrated interface that provides various raw data or signal conditioning, processing, and/or conversion, short-circuit protection, and the like. Alternatively, one or more dedicated hardware or firmware chips may be used to condition and process particular signals before being supplied to the CPU. Although not explicitly illustrated, the system controller may communicate signals to and/or from the transmission 202, electric machines 204, 206, engine 208, contactors 212, converter 226, and battery monitor sensor 224. Representative examples of parameters, systems, and/or components that may be directly or indirectly actuated using control logic executed by the system controller include fuel injection timing, rate, and duration, throttle valve position, spark plug ignition timing (for spark-ignition engines), intake/exhaust valve timing and duration, front-end accessory drive (FEAD) components such as an alternator, air conditioning compressor, battery charger, regenerative braking, motor/generator operation, clutch pressures for the transmission 202, and the like. Sensors communicating input through the I/O interface may be used to indicate turbocharger boost pressure, crankshaft position (PIP), engine rotational speed (RPM), wheel speeds (WS1, WS2), vehicle speed (VSS), coolant temperature (ECT), intake manifold pressure (MAP), accelerator pedal position (PPS), ignition switch position (IGN), throttle valve position (TP), air temperature (TMP), exhaust gas oxygen (EGO) or other exhaust gas component concentration or presence, intake air flow (MAF), transmission gear, ratio, or mode, transmission oil temperature (TOT), transmission turbine speed (TS), torque converter bypass clutch 34 status (TCC), deceleration or shift mode (MDE), for example.

Control logic or functions performed by the system controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but is provided for ease of illustration and description. The control logic may be implemented primarily in software executed by a microprocessor-based vehicle, engine, and/or powertrain controller, such as PCM 228 in one example. Of course, the control logic may be implemented in software, hardware, or a combination of software and hardware in one or more controllers depending upon the particular application. For instance, in some examples some or all of the control logic may be executed by a cloud service offboard the vehicle 102. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

Figure 3:
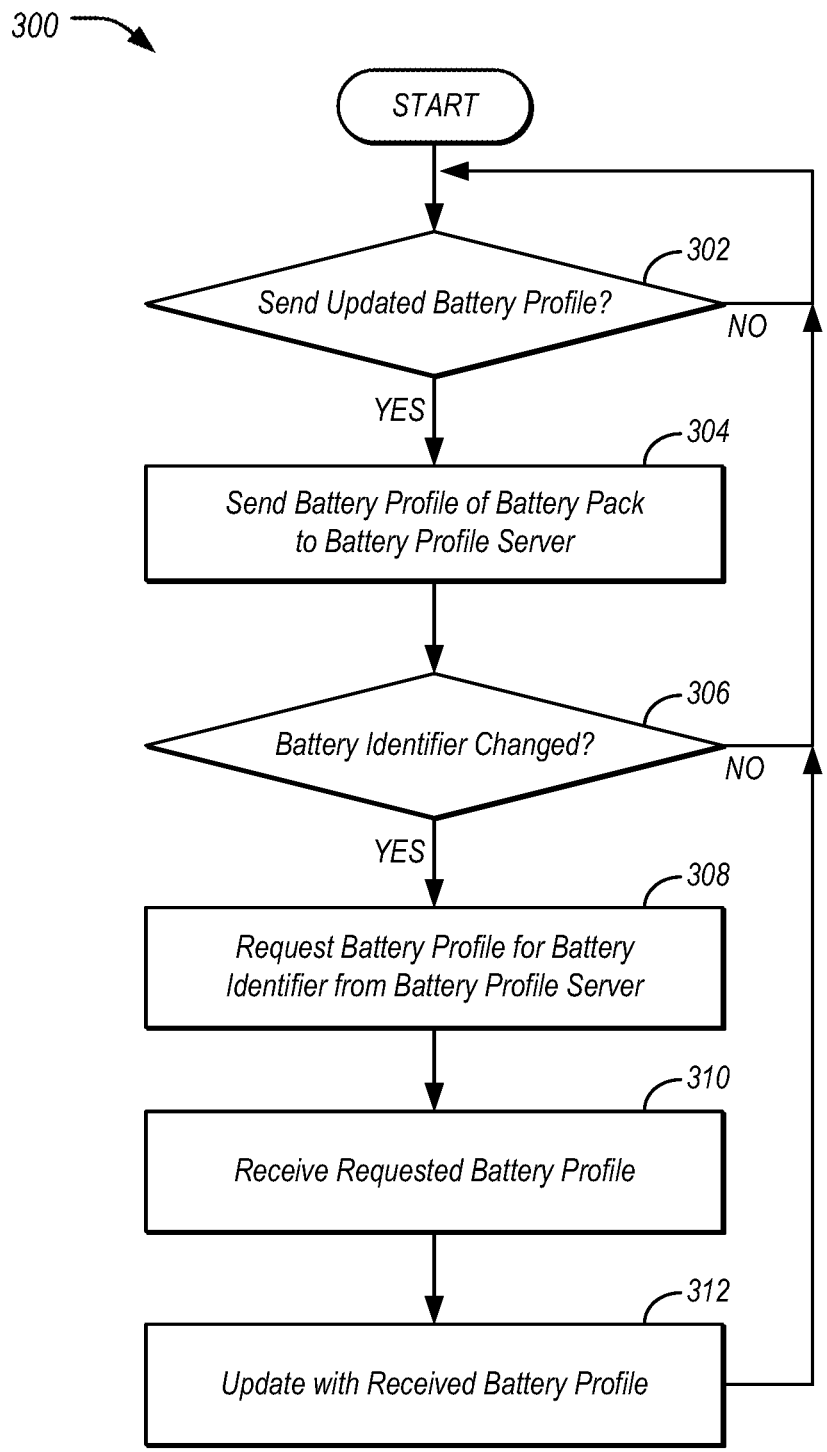
FIG. 3 illustrates an example process for provisioning battery profiles to vehicles.

FIG. 3 illustrates an example process 300 for provisioning battery profiles 110 to vehicles 102. The process 300 may be implemented using the system controller described in detail above.

At operation 302, the system controller determines whether to send an updated battery profile 110 to the battery profile server 108. In an example, the system controller may be programmed to periodically send the battery profile 110 from the vehicle 102 to the battery profile server 108. This period may be, for example, a time period such as a day, a week, or a month. Additionally, or alternately, the period may include a predefined distance of travel of the vehicle 102 (e.g., 100 kilometers, 500 kilometers, 1000 kilometers). If the system controller determines to send an updated battery profile 110, control passes to operation 304. Otherwise, control remains at operation 302.

At 304, the system controller sends the battery profile 110 of the HV battery pack 112 to the battery profile server 108. In an example, the system controller may query for the current battery profile 110 being utilized by the BECM 232, as well as for a unique identifier of the HV battery 112. This information may be sent using the cellular modem 218 (or WiFi modem 220) to the battery profile server 108.

At operation 306, the system controller determines whether an identifier of the HV battery pack 112 has changed. In an example, the system controller may query the HV battery pack 112 for its battery identifier 210. If the battery identifier 210 has changed since the last query, control passes to operation 308. Otherwise, control returns to operation 302.

At 308, the system controller requests a battery profile 110 of the HV battery pack 112 identified by the new battery identifier 210 indicated at operation 306. In an example, the system controller requests for the cellular modem 218 (or WiFi modem 220) to access the battery profile server 108 over the wide-area network 104 to request that the battery profile server 108 send a battery profile 110 corresponding to the battery identifier 210. The system controller receives the requested battery profile 110 at 310, responsive to the request at 308.

At operation 312, the system controller updates with the battery profile 110 that was received. Accordingly, the BECM 232 is updated with the characteristics of the current HV battery pack 112, without expending the time for the BECM 232 to have to learn the new characteristics. After operation 312, control returns to operation 302.

Figure 4:
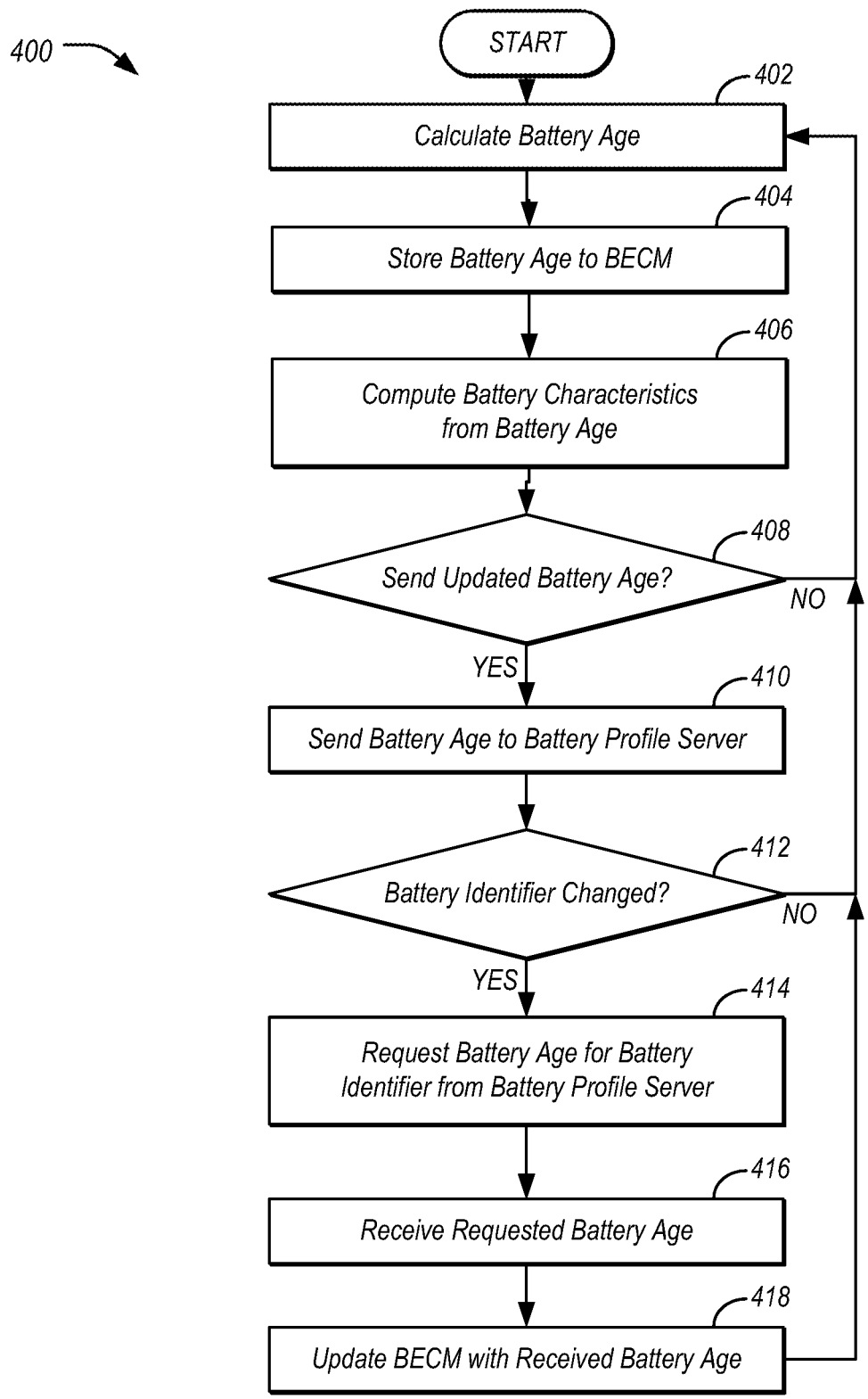
FIG. 4 illustrates an example process for utilizing battery age as a factor in provisioning battery profiles to vehicles.

FIG. 4 illustrates an example process 400 for utilizing battery age as a factor in provisioning battery profiles 110 to vehicles 102. As with the process 300, the process 400 may be implemented using the system controller described in detail above.

At operation 402, the system controller calculates an age of the HV battery pack 112. In an example, the system controller retrieves a build date from the HV battery pack 112. Based on the build date and a current date, the system controller determines a health of the HV battery pack 112. For instance, battery age may be a factor in battery health.

At 404, the system controller stores the age of the HV battery pack 112 to the BECM 232. In an example, the system controller writes the battery age to the BECM 232 via a predefined DID. The DID (Data Identifier) diagnostic mechanism is defined in SAE J1979 (also called PID) and allows an ECU to set aside a predefined set of information at an address that can be called via a diagnostic method. DIDs may hold information that provides insight to system status and performance. A specific DID may be used to maintain the battery age, in an example.

At operation 406, the system controller computes battery characteristics of the HV battery pack 112 based on the battery age. In an example, these characteristics include pack capacity and power capability.

At 408, the system controller determines whether to send the updated battery age information as the battery profile 110 to the battery profile server 108. In an example, the system controller may be programmed to periodically send the battery age from the vehicle 102 to the battery profile server 108. This period may be, for example, a time period such as a day, a week, or a month. Additionally, or alternately, the period may include a predefined distance of travel of the vehicle 102 (e.g., 100 kilometers, 500 kilometers, 1000 kilometers). If the system controller determines to send an updated battery age, control passes to operation 410. Otherwise, control returns to operation 402.

At 410, the system controller sends the battery age to the battery profile server 108. In an example, the system controller may query for the current battery age being utilized by the BECM 232, as well as for a unique identifier of the HV battery 112. This information may be sent using the cellular modem 218 (or WiFi modem 220) to the battery profile server 108.

At 412, the system controller determines whether an identifier of the HV battery pack 112 has changed. In an example, the system controller may query the HV battery pack 112 for its battery identifier 210. If the battery identifier 210 has changed since the last query, control passes to operation 414. Otherwise, control returns to operation 402.

At 414, the system controller requests the battery age from the battery profile server 108. In an example, the system controller requests for the cellular modem 218 (or WiFi modem 220) to access the battery profile server 108 over the wide-area network 104 to request that the battery profile server 108 send a battery age corresponding to the battery identifier 210. The system controller receives the requested battery age at 416, responsive to the request at 414.

At 418, the system controller updates the BECM 232 with the received battery age. In an example, the system controller writes the battery age to the BECM 232 via a predefined DID (e.g., 0x4810). After operation 418, control passes to operation 402.

In general, computing systems and/or devices may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance.

Computing devices such as those of the system controller, generally include computer-executable instructions that may be executable by one or more processors of the computing devices. Computer-executable instructions may be compiled or interpreted from computer programs created using a variety of programming languages and/or technologies, including, without limitation, and either alone or in combination, JAVA™, C, C++, VISUAL BASIC, JAVA SCRIPT, PERL, etc. In general, a processor or microprocessor receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computing device). Such a medium may take many forms, including, but not limited to, non-volatile media and volatile media. Non-volatile media may include, for example, optical or magnetic disks and other persistent memory. Volatile media may include, for example, dynamic random-access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein. Some or all of the operations disclosed herein as being performed by the system controller may be such computer program products. In some examples, these computer program products may be provided as software that when executed by one or more processors provides the operations described herein. Alternatively, the computer program products may be provided as hardware or firmware, or combinations of software, hardware, and/or firmware.

While exemplary embodiments are described above, it is not intended that these embodiments describe all possible forms of the invention. Rather, the words used in the specification are words of description rather than limitation, and it is understood that various changes may be made without departing from the spirit and scope of the invention.

Additionally, the features of various implementing embodiments may be combined to form further embodiments of the invention.

What is claimed is:

1. A system comprising:
   a memory storing a battery profile corresponding to a battery identifier of a high-voltage battery of a vehicle; and
   a processor of the vehicle programmed to
      send a battery age of the battery and the battery identifier of the battery to a server configured to maintain battery ages for a plurality of high-voltage batteries indexed according to battery identifier, each battery corresponding to a different unique battery identifier,
      responsive to detecting a swap of the high-voltage battery with a second high-voltage battery due to a change in the battery identifier, request the server to send a second battery age corresponding to the battery identifier as changed to provide the vehicle with the most recent battery age stored to the server for the second high-voltage battery,
      compute battery characteristics of the second high-voltage battery according to the second battery age, the battery characteristics including a storage capacity of the second battery and a battery and a batter power capability of the second high-voltage battery, and
      configure the battery profile with the battery characteristics.

2. The system of claim 1, wherein the battery profile information indicative of the storage capacity and the battery power capability of the battery is indicative of overall state of health of the battery.

3. The system of claim 1, wherein the processor is further programmed to utilize the battery profile to adapt a battery control strategy according to at least the storage capacity of the second battery and the battery power capability of the second battery.

4. The system of claim 1, wherein the processor is further programmed to periodically send the battery age responsive to the vehicle traveling a predefined distance.

5. The system of claim 1, wherein the processor is further programmed to periodically send the battery age responsive to passage of a predefined period of time.

6. The system of claim 1, wherein the processor is further programmed to identify the battery identifier via a connection of a system including the high-voltage battery to a vehicle bus.

7. The system of claim 1, wherein the processor is further programmed to identify the battery identifier responsive to receipt of barcode information scanned from the battery.

8. The system of claim 1, wherein the processor is further programmed to write the battery age to a predefined memory address of a battery energy control module of the vehicle.

9. The system of claim 1, wherein the battery characteristics of the second high-voltage battery computed according to the second battery age include pack capacity and power capability.

10. A method comprising:
    responsive to detecting, by a vehicle, a swap of a battery of a vehicle with a second battery due to a change in a battery identifier, requesting a server, in communication with the vehicle over a wide-area network, to send a battery age corresponding to the battery identifier to the vehicle to provide the vehicle with the most recent battery age stored to the server for the second battery;
    computing battery characteristics of the second battery according to the battery age for the second battery, the battery characteristics including a storage capacity of the second battery and a battery power capability of the second battery; and
    utilizing a battery profile including the battery characteristics to adapt a battery control strategy for the battery according to at least the storage capacity of the second battery and the battery power capability of the second battery.

11. The method of claim 10, further comprising updating the battery profile responsive to measurements of performance of the battery.

12. The method of claim 11, further comprising sending the battery profile, as updated, to the server responsive to passage of a predefined period of time since a previous sending of the battery profile to the server.

13. The method of claim 11, further comprising sending the battery profile, as updated, to the server responsive to travel of a predefined distance since a previous sending of the battery profile to the server.

14. The method of claim 10, further comprising:
    maintaining the battery identifier in a storage of a controller; and
    detecting a change in the battery identifier responsive to reading the battery identifier from the battery and comparing the battery identifier as read to the battery identifier as stored.

15. The method of claim 10, wherein the battery is a traction battery configured to power one or more electric motors of the vehicle.

16. The method of claim 10, further comprising utilizing the battery profile to adapt a battery control strategy of the vehicle to characteristics of the battery.

17. A non-transitory computer-readable medium comprising instructions that, when executed by a processor of a vehicle, cause the vehicle to:
    responsive to detection of a swap of a battery of a vehicle with a second battery due to a change in a battery identifier of a battery of the vehicle, request a server in communication with the vehicle over a wide-area network to send a battery age corresponding to the battery identifier to the vehicle to provide the vehicle with the most recent battery age stored to the server for the second battery;
    compute battery characteristics of the second battery according to the battery age for the second battery, the battery characteristics including a storage capacity of the second battery and a battery power capability of the second battery; and
    utilize a battery profile including the battery characteristics to adapt a battery control strategy for the battery according to at least the storage capacity of the second battery and the battery power capability of the second battery.

18. The non-transitory computer-readable medium of claim 17, further comprising instructions that, when executed by the processor, cause the vehicle to update the battery profile responsive to measurements of performance of the battery.

19. The non-transitory computer-readable medium of claim 18, further comprising instructions that, when executed by the processor, cause the vehicle to send the battery profile, as updated, to the server responsive to passage of a predefined period of time since a previous sending of the battery profile to the server.

20. The non-transitory computer-readable medium of claim 17, further comprising instructions that, when executed by the processor, cause the vehicle to send the battery profile, as updated, to the server responsive to travel of a predefined distance since a previous sending of the battery profile to the server.

21. The non-transitory computer-readable medium of claim 17, further comprising instructions that, when executed by the processor, cause the vehicle to:
   maintain the battery identifier in a storage of a controller; and
   detect a change in the battery identifier responsive to reading the battery identifier from the battery and comparison of the battery identifier as read to the battery identifier as stored.

22. The non-transitory computer-readable medium of claim 17, wherein the battery is a traction battery configured to power one or more electric motors of the vehicle.

23. The non-transitory computer-readable medium of claim 17, further comprising instructions that, when executed by the processor, cause the vehicle to utilize the battery profile to adapt a battery control strategy of the vehicle to characteristics of the battery.

\* \* \* \* \*